United States Patent
Sir et al.

(10) Patent No.: US 11,908,793 B2
(45) Date of Patent: *Feb. 20, 2024

(54) STRIPPED REDISTRUBUTION-LAYER FABRICATION FOR PACKAGE-TOP EMBEDDED MULTI-DIE INTERCONNECT BRIDGE

(71) Applicant: Intel Corporation, Santa Clara, CA (US)

(72) Inventors: Jiun Hann Sir, Gelugor (MY); Poh Boon Khoo, Perai (MY); Eng Huat Goh, Ayer Itam (MY); Amruthavalli Pallavi Alur, Tempe, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/716,937

(22) Filed: Apr. 8, 2022

(65) Prior Publication Data

US 2022/0230958 A1 Jul. 21, 2022

Related U.S. Application Data

(63) Continuation of application No. 17/200,700, filed on Mar. 12, 2021, now Pat. No. 11,658,111, which is a continuation of application No. 16/384,348, filed on Apr. 15, 2019, now Pat. No. 10,998,262.

(51) Int. Cl.
*H01L 23/522* (2006.01)
*H01L 23/00* (2006.01)

(52) U.S. Cl.
CPC .......... *H01L 23/5226* (2013.01); *H01L 24/09* (2013.01); *H01L 24/17* (2013.01);
(Continued)

(58) Field of Classification Search
CPC ..... H01L 23/5226; H01L 24/09; H01L 24/17; H01L 2924/01029; H01L 25/18;
(Continued)

(56) References Cited

U.S. PATENT DOCUMENTS

| 2014/0117552 A1 | 5/2014 | Qian |
| 2016/0020164 A1 | 1/2016 | Terui |

(Continued)

FOREIGN PATENT DOCUMENTS

WO   WO 2017/111957   6/2017

OTHER PUBLICATIONS

Office Action from German Patent Application No. 102020002273.1, dated Sep. 28, 2020, 8 pgs.
(Continued)

*Primary Examiner* — Jasmine J Clark
(74) *Attorney, Agent, or Firm* — Schwabe, Williamson & Wyatt, P.C.

(57) ABSTRACT

An embedded multi-die interconnect bridge (EMIB) is fabricated on a substrate using photolithographic techniques, and the EMIB is separated from the substrate and placed on the penultimate layer of an integrated-circuit package substrate, below the top solder-resist layer. A low Z-height of the EMIB, allows for useful trace and via real estate below the EMIB, to be employed in the package substrate.

22 Claims, 6 Drawing Sheets

(52) U.S. Cl.
CPC .............. *H01L 2224/02371* (2013.01); *H01L 2224/02372* (2013.01); *H01L 2924/01029* (2013.01)

(58) Field of Classification Search
CPC ........... H01L 23/5385; H01L 23/49816; H01L 2224/17181; H01L 2924/15311; H01L 25/0652; H01L 24/16; H01L 2224/16145; H01L 2224/16146
USPC ........................................................ 257/692
See application file for complete search history.

(56) References Cited

U.S. PATENT DOCUMENTS

| | | |
|---|---|---|
| 2016/0095219 A1 | 3/2016 | Sakamoto |
| 2018/0226364 A1 | 8/2018 | Kim |
| 2019/0051642 A1 | 2/2019 | Gupta Hyde |
| 2019/0103872 A1 | 4/2019 | Clark |
| 2019/0109117 A1 | 4/2019 | Fang |
| 2019/0206792 A1 | 7/2019 | Collins |
| 2019/0355642 A1 | 11/2019 | Brown |
| 2020/0083170 A1 | 3/2020 | Cheah |
| 2021/0202380 A1* | 7/2021 | Sir ..................... H01L 25/0652 |

OTHER PUBLICATIONS

Office Action from German Patent Application No. 102020002273.1, dated Nov. 15, 2021, 5 pgs.
Notice of Allowance from German Patent Application No. 102020002273.1, dated Jul. 21, 2022, 9 pgs., No. translation.
Office Action for U.S. Appl. No. 17/200,700 dated Jul. 22, 2022, 8 pgs.
Notice of Allowance for U.S. Appl. No. 17/200,700 dated Jan. 31, 2023, 7 pgs.

* cited by examiner

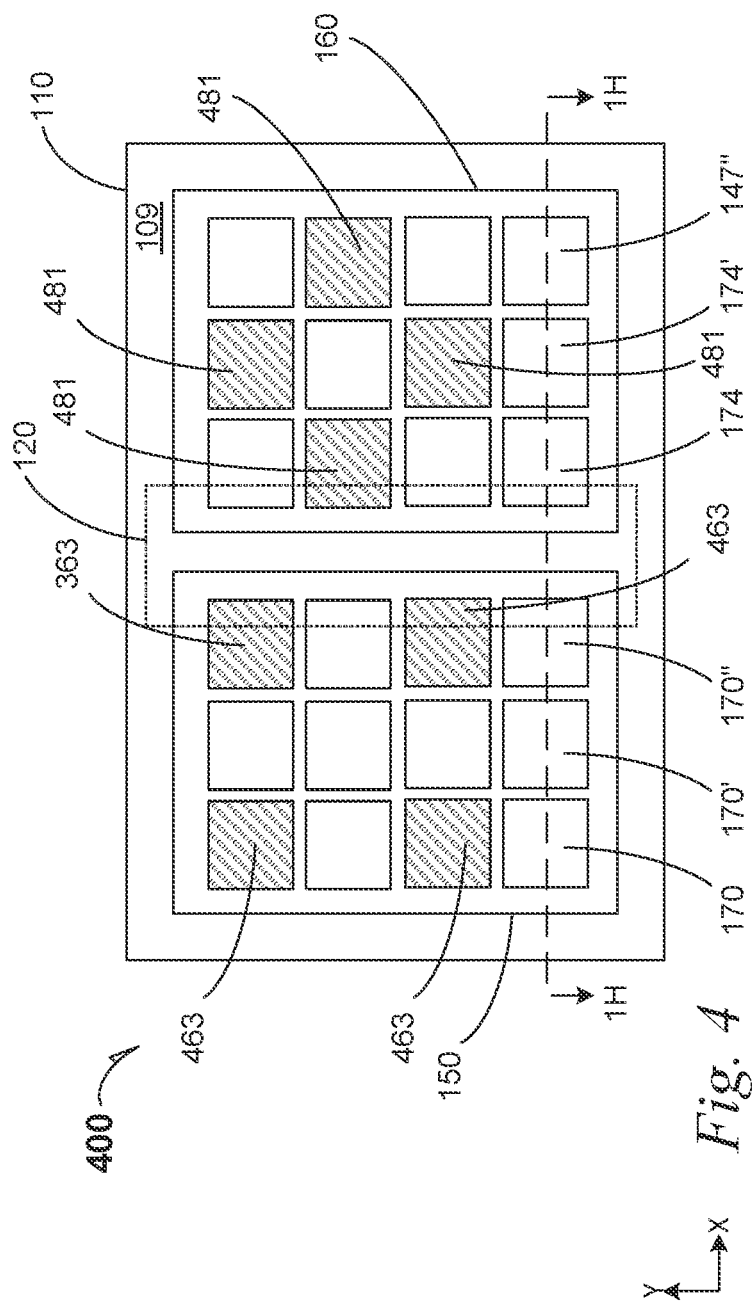

STRIPPED REDISTRUBUTION-LAYER FABRICATION FOR PACKAGE-TOP EMBEDDED MULTI-DIE INTERCONNECT BRIDGE

CROSS-REFERENCE TO RELATED APPLICATIONS

This application is a Continuation of U.S. patent application Ser. No. 17/200,700, filed Mar. 12, 2021, which is a Continuation of U.S. patent application Ser. No. 16/384,348, filed on Apr. 15, 2019, now U.S. Pat. No. 10,998,262, issued May 4, 2021, the entire contents of which are hereby incorporated by reference herein.

FIELD

This disclosure relates to embedded multi-chip interconnect bridges that are seated near the die side of integrated-circuit device packages.

BACKGROUND

Integrated circuit miniaturization during interconnecting, experiences package real estate budget issues.

BRIEF DESCRIPTION OF THE DRAWINGS

Disclosed embodiments are illustrated by way of example, and not by way of limitation, in the figures of the accompanying drawings where like reference numerals may refer to similar elements, in which.

Figure 1A:
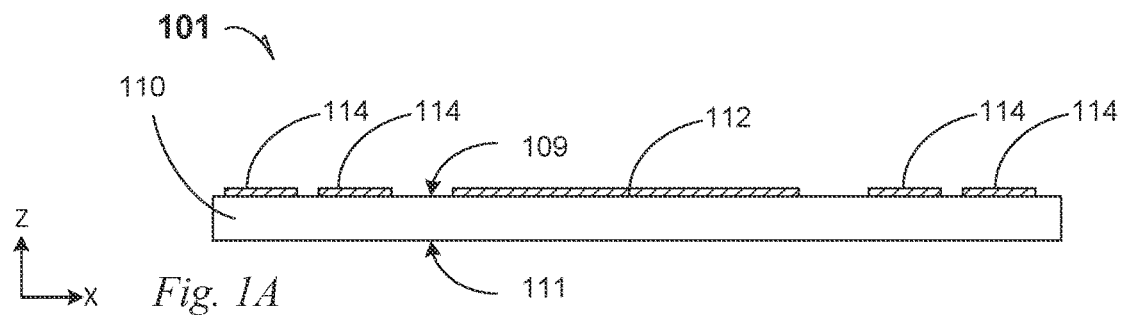
FIG. 1A is a cross-section of an integrated-circuit package substrate during assembly according to an embodiment.
Figure 1B:
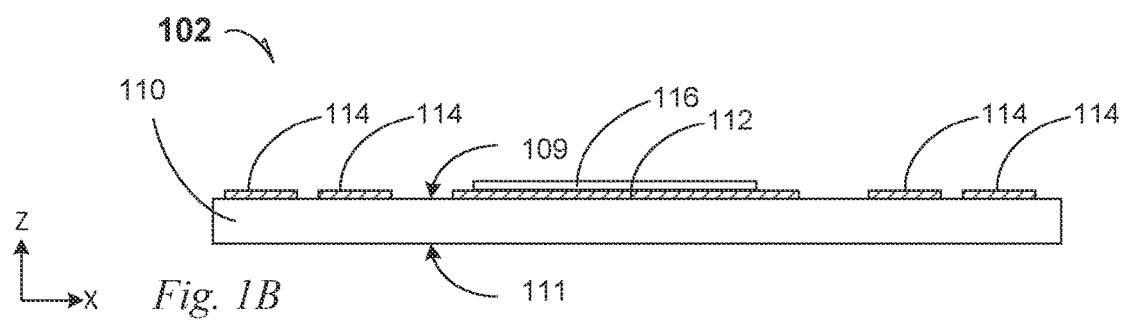
FIG. 1B is a cross-section elevation of the integrated-circuit package substrate depicted in FIG. 1A after further assembly according to an embodiment.
Figure 1C:
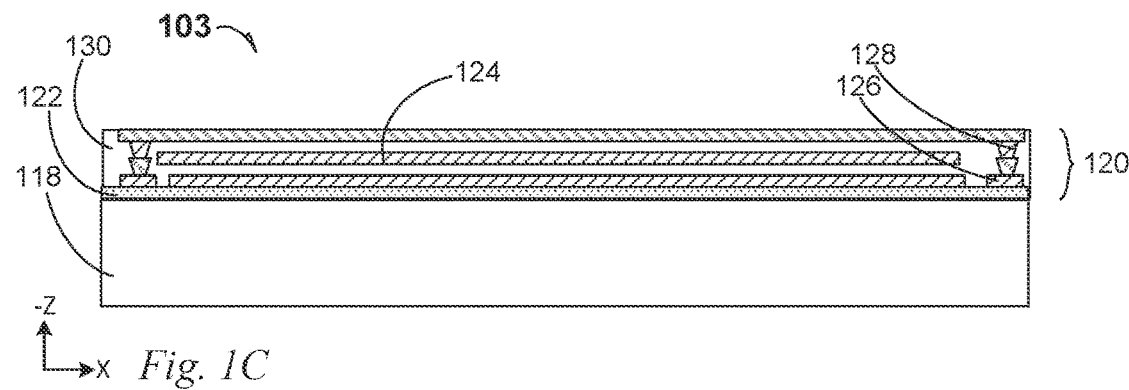
FIG. 1C is a cross-section elevation of a stripped embedded multi-die interconnect bridge during assembly on a glass substrate according to an embodiment.
Figure 1D:
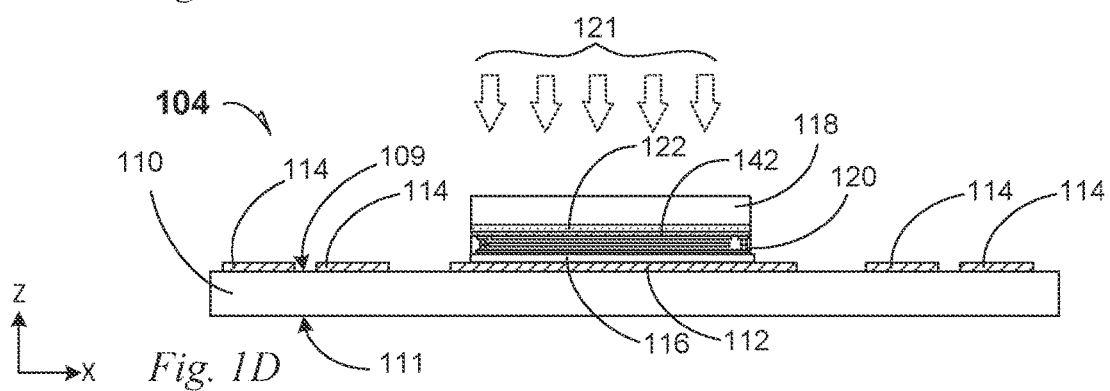
FIG. 1D is a cross-section elevation of the integrated-circuit package substrate depicted in FIG. 1B and the glass-mounted stripped embedded multi-die interconnect bridge depicted in FIG. 1C after further processing according to an embodiment.
Figure 1E:
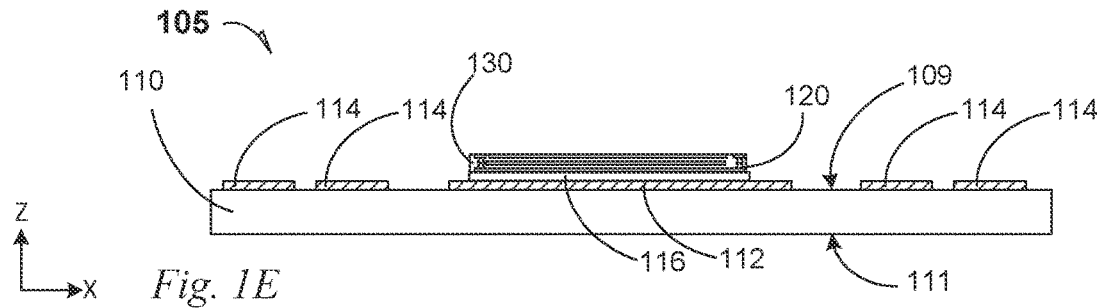
FIG. 1E is a cross-section elevation of the integrated-circuit package substrate depicted in FIG. 1D and after further processing according to an embodiment.
Figure 1F:
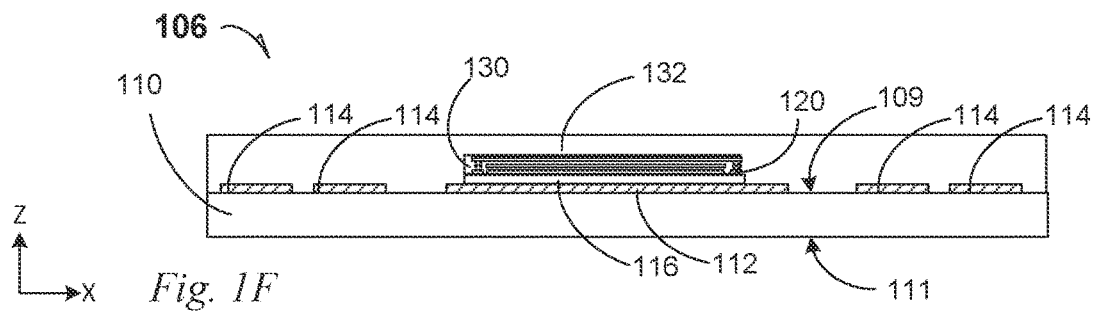
FIG. 1F is a cross-section elevation of the integrated-circuit package substrate depicted in FIG. 1E after further processing according to an embodiment.
Figure 1G:
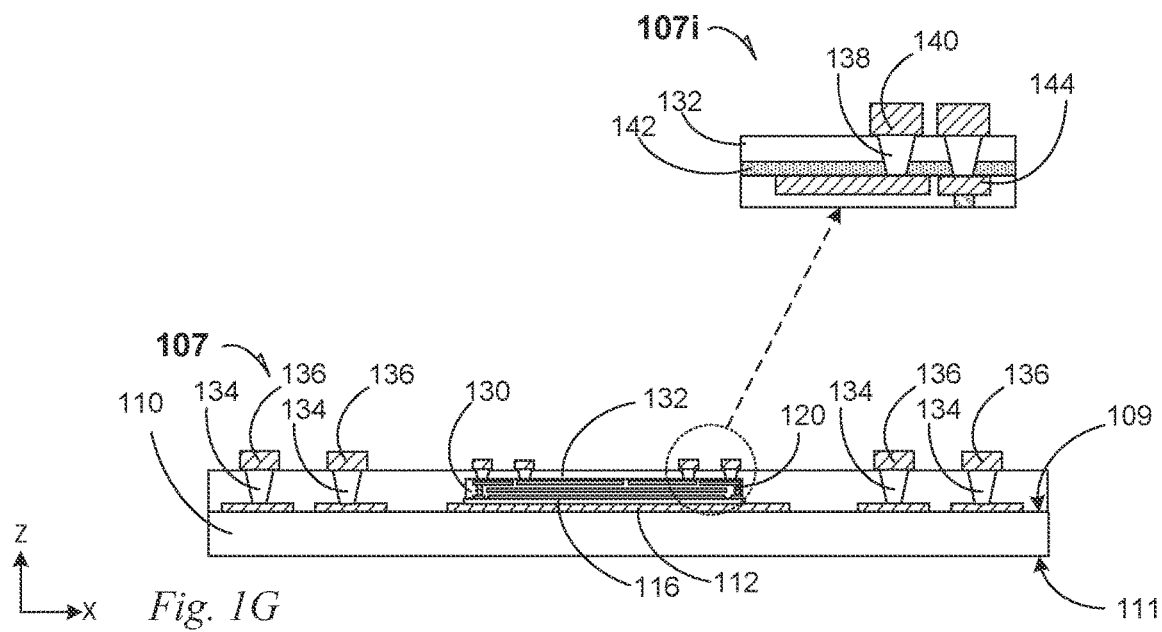
FIG. 1G is a cross-section elevation of the integrated-circuit package substrate depicted in FIG. 1F after further processing according to an embodiment.
Figure 1H:
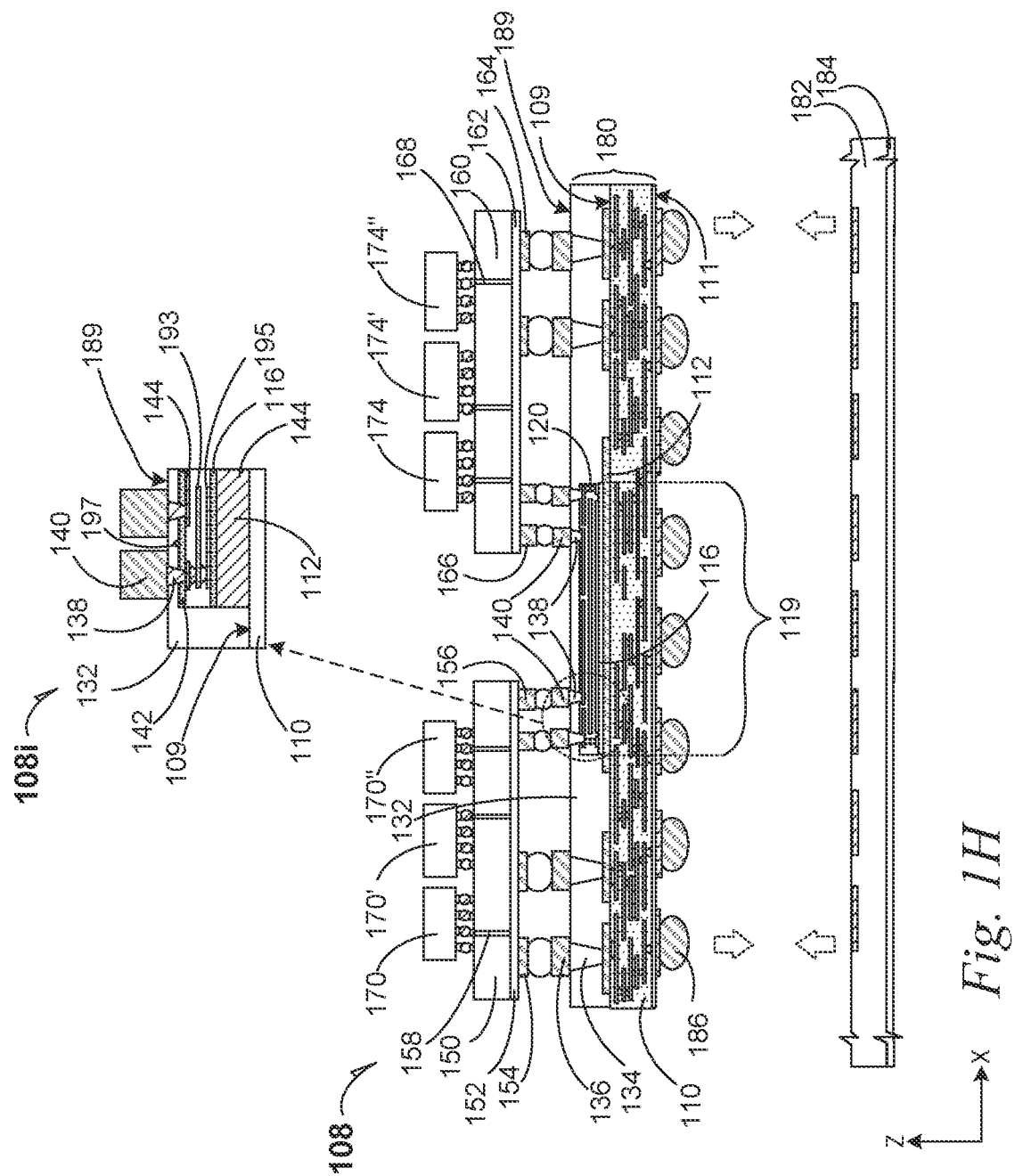
Figure 2:
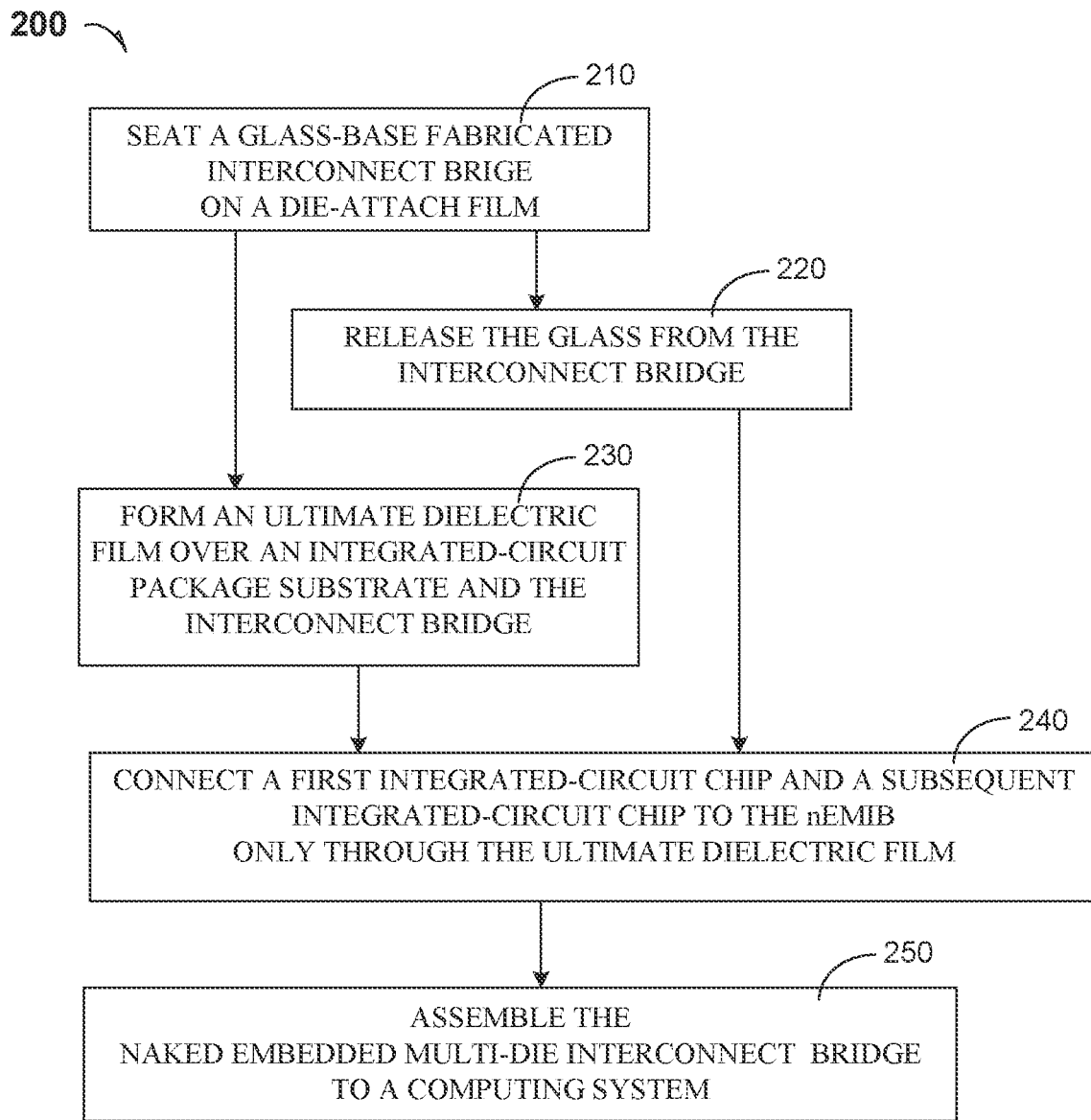
Figure 3:
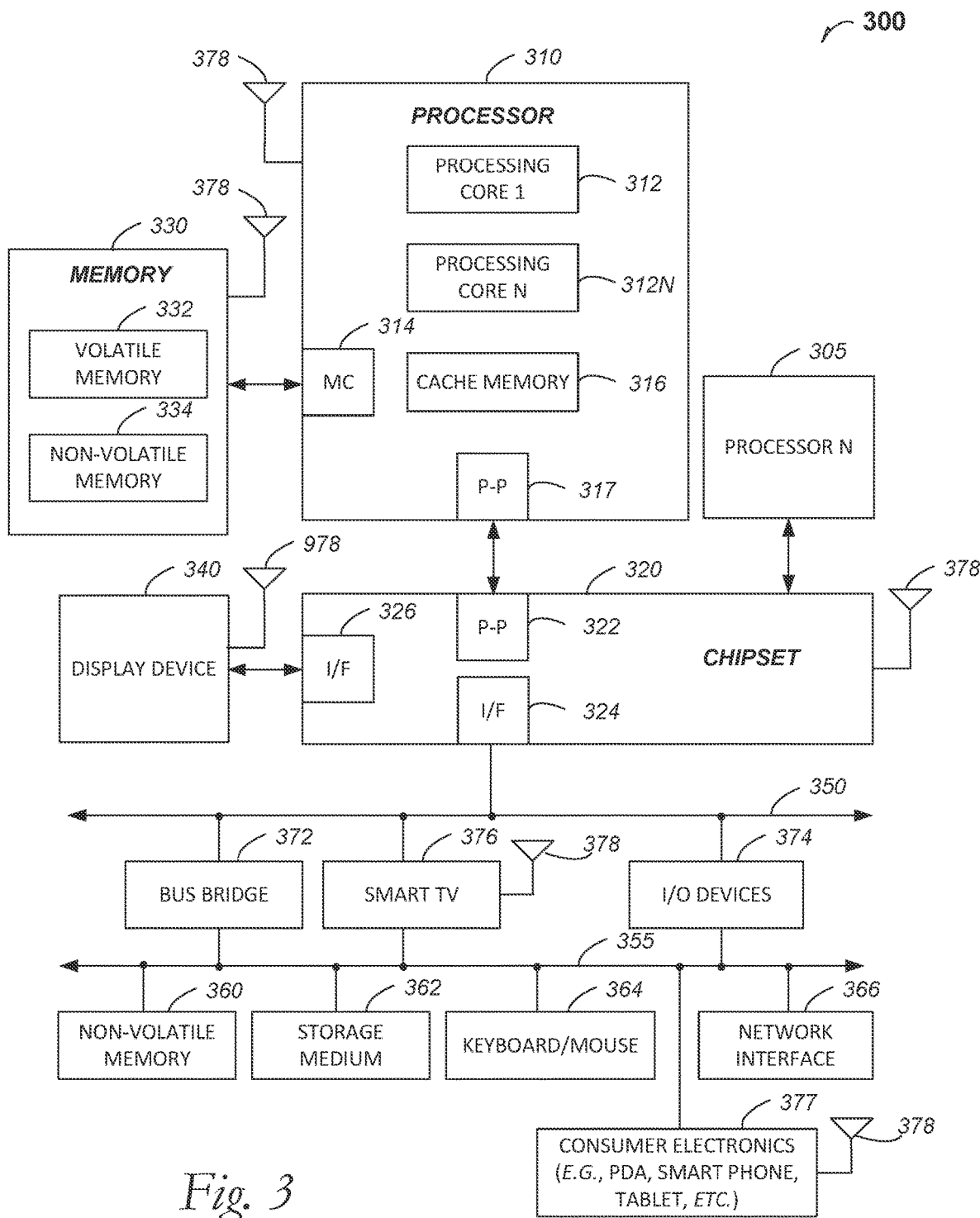

Inset 107i illustrates formation of the bridge-via corridors includes penetrating the build-up film, as well as penetrating a bridge polyimide film in order to reach, e.g. a bridge bond pad according to several embodiments;

FIG. 1H is a cross-section elevation of an integrated-circuit device package that is assembled from the integrated-circuit package and the processed build-up film depicted in FIG. 1G and Inset 107i according to several embodiments;

Inset 108i depicts the stripped embedded-multi-die interconnect bridge as laid out in a three-level-trace and bond-pad configuration according to an embodiment;

FIG. 2 is a process flow diagram according to several embodiments;

FIG. 3 is included to show an example of a higher-level device application for the disclosed embodiments; and FIG. 4 is a top plan and partial cut-away of the computing system depicted in FIG. 1H according to several embodiments.

DETAILED DESCRIPTION

A silicon bridge interconnect is seated just below the top solder-resist layer, after fabricating the bridge interconnect on a glass substrate, and removing the glass substrate. Fabrication of the interconnect layers is done in an inverted configuration compared to that of fabricating an existing silicon bridge interconnect. Stripping of the glass substrate, from the interconnect layers allows for a useful low Z-height of the interconnect bridge where only the interconnect materials remain, and embedding the "stripped" interconnect bridge just below the top solder-resist layer, saves valuable interconnect layers in the package substrate, below the interconnect bridge; at least two copper layers. Stripping of the glass substrate from the interconnect layers of the stripped bridge, also allows for thinner upper layers in the dielectric of the package substrate, which improves signal referencing. Consequently, the stripped embedded multi-die interconnect bridge (sEMIB) allows an integrated-circuit package substrate to retain, e.g. a 3-2-3 package-layer count, instead of a larger 4-2-4 package-layer count. The sEMIB may also be referred to as a stripped redistribution layer (sRDL).

An integrated circuit is fabricated in a substrate that may be semiconductive, such as silicon, doped silicon, and III-V material combinations. Other semiconductive materials may be used such as semiconductive carbon in nanotube configurations. After fabrication, the integrated circuit may be singulated from an array of integrated circuits, into an integrated-circuit chip, or IC chip.

FIG. 1A is a cross-section elevation 101 of an integrated-circuit package substrate during assembly according to an embodiment. A build-up film 110 is used as a basis for forming a metallic plate 112 and bond pads 114, among other structures, for connecting at least two integrated circuits (see FIG. 1H) through a stripped embedded multi-die interconnect bridge (sEMIB). In an embodiment, patterning of the metallic plate 112 and the bond pads 114 is done by patterning the structures 112 and 114 from a single copper-containing layer.

In an embodiment, the build-up film 110 is a partially completed integrated-circuit package substrate 110 with a temporary die side 109 that will accept at least two integrated circuits through an sEMIB, and a land side 111 that will be bonded to a board such as a to a printed wiring board.

FIG. 1B is a cross-section elevation of the integrated-circuit package substrate 101 depicted in FIG. 1A after further assembly according to an embodiment. The integrated-circuit package substrate 102 has been processed by seating a die-attach film 116 on the metallic plate 112, in anticipation of receiving an sEMIB redistribution layer.

FIG. 1C is a cross-section elevation 103 of a stripped embedded multi-die interconnect bridge (sEMIB) 120 during assembly on a glass substrate 118 according to an embodiment. The Z-direction coordinate is inverted compared to orientation of the integrated-circuit package substrate 102 depicted in FIG. 1B.

A glass substrate 118 is used for patterning and forming an EMIB structure 120 by using lithographic techniques and building the EMIB 120 on a release layer 122. The glass substrate 118 is a semiconductor package-substrate quality structure with a useful flatness and thermal and physical stability for fabrication of silicon interconnect bridges. Techniques for forming silicon EMIBs on semiconductive material, include to fabricate a "silicon bridge," by fabricating the EMIB 120 on the glass substrate 118, followed by stripping the glass substrate 118.

In an embodiment, the EMIB 120 includes traces, e.g. 124, bond pads, e.g. 126, and vias, e.g. 128, with an organic matrix 130 that is several build-up dielectric layers. As illustrated and in an embodiment, a three-trace-layer redistribution layer 120 has been fabricated.

FIG. 1D is a cross-section elevation of the integrated-circuit package substrate 102 depicted in FIG. 1B and the glass-mounted EMIB 103 depicted in FIG. 1C after further processing according to an embodiment. The glass substrate 118 and the EMIB 120 are inverted compared to the depiction in FIG. 1C.

In an embodiment, the EMIB 120 is affixed to the die-attach film 116, and the release layer 122 is being irradiated by ultraviolet light 121, to allow the glass substrate 118 to be removed, as well as the release layer 122. Patterning includes transmitting light energy through the inorganic substrate 118.

FIG. 1E is a cross-section elevation of the integrated-circuit package substrate 104 depicted in FIG. 1D and after further processing according to an embodiment. The integrated-circuit package substrate 105 has been processed by removing the release layer 122 and stripping the glass substrate 118 (see FIG. 1D) in preparation further building up and connecting the substrate 110 to at least two integrated circuits through the stripped redistribution layer 120.

FIG. 1F is a cross-section elevation of the integrated-circuit package substrate 105 depicted in FIG. 1E after further processing according to an embodiment. The integrated-circuit package substrate 106 has been processed by forming a build-up film 132 in preparation for forming contact vias for both the integrated-circuit package substrate as well as for the stripped embedded multi-die interconnect bridge (sEMIB) 120. In an embodiment, the build-up film 132 is a single solder-resist material that is curable by useful light wavelengths, whether a positive photoresist or a negative photoresist. Accordingly, The Z-height of the plate 112 and the bond pads 114 is about 12 micrometer (μm), the die-attach film is about 5 μm, the sEMIB 120 is about 10 μm, and the portion of the build-up film 132 above the sEMIB 120 is about 5-10 μm.

FIG. 1G is a cross-section elevation of the integrated-circuit package substrate 106 depicted in FIG. 1F after further processing according to an embodiment. The integrated-circuit package substrate 107 has been processed by opening contact corridors in the build-up film 132, and filling package vias 134 to the bond pads 114 (see FIG. 1F), as well as forming package copper studs 136 that contact the package vias 134.

Further processing includes opening bridge-via corridors in the build-up film 132, and filling bridge vias 138 (see the inset 107*i*) as well as bridge copper studs 140.

The inset 107*i* illustrates formation of the bridge-via corridors includes penetrating the build-up film 132, as well as penetrating a bridge polyimide film 142 in order to reach, e.g. a bridge bond pad 144. The bridge polyimide film 142 is part of the sEMIB 120 that remains after the EMIB 120 (see FIG. 1D) is separated from the glass substrate 118 and the release layer 122.

Removing the release layer 122 and the glass substrate 118 (see FIG. 1D) is done in preparation further building up and connecting the integrated-circuit package substrate 110 to at least two integrated circuits through the sEMIB 120.

FIG. 1H is a cross-section elevation of an integrated-circuit device package 108 that is assembled from the integrated-circuit package substrate 110 and the processed build-up film 132 depicted in FIG. 1G and Inset 107*i* according to several embodiments.

The integrated-circuit package substrate 110, along with the build-up film 132, form a perimeter of an integrated-circuit package substrate 180 that carries the stripped embedded multi-die interconnect bridge (sEMIB) 120. Characteristic of an sEMIB embodiment, the sEMIB 120 is attached to the integrated-circuit package substrate 110 with the die-attach film 116, and essentially only the buildup film 132 covers the sEMIB 120 as it is in the ultimate build-up layer of the integrated-circuit package substrate 180. The sEMIB 120 leaves useful printed-wiring-board real estate within the integrated-circuit package substrate 110, where it is available below the sEMIB 120. Further, a die side 189 of the integrated-circuit package substrate 180, only covers the sEMIB 120, which is seated on the temporary die side 109 and attached with the die-attach film 116. Accordingly, no remaining glass or otherwise, extends into the useful real estate of the integrated-circuit package substrate 110.

In an embodiment, the sEMIB 120 is configured to connect with a first integrated circuit chip 150 and a subsequent integrated circuit chip 160. Bridge bond pads 156 and 166 couple to the sEMIB 120, through the bridge vias 138 (two reference lines) as well as bridge copper studs 140 (two reference lines).

Each of the respective first and subsequent integrated circuit chips 150 and 160, is also coupled to the integrated-circuit package substrate 180 in substrate vias 134, that communicate to the land side 111.

Accordingly, the sEMIB 120 appears as a redistribution layer (RDL) with photolithographically formed traces and vias, with no glass, nor semiconductor substrate remaining, and a die-attach film 116 seating the sEMIB 120 onto a metallic plate 112, and only the build-up film 132 covering the sEMIB 120 at the die side 189 of the integrated-circuit package substrate 180.

The copper pillar 136 contacts an electrical bump that contacts a bonding pad 154 that is part of the first integrated-circuit die 150. Similarly, copper pillar contacts an electrical bump that contacts a bonding pad 164 that is part of the subsequent integrated-circuit die 160.

As illustrated, more detail of traces and vias is given generally in the cross-section view of the integrated-circuit package substrate 110, including immediately below the footprint 119 of the sEMIB 120, where traces and vias do not appear any less densely, nor differently arrayed in the integrated-circuit package substrate 110 within the footprint 119, than in any other region of the integrated-circuit package substrate 110. Specific trace and via density is selected depending upon useful design rules and connections between integrated circuit devices, passive devices and connections to a board 182.

In an embodiment after forming electrical bumps 186 on the land side 111, the integrated-circuit package substrate 110 is seated on a board 182 such as a printed-wiring-board motherboard 182. In an embodiment, the board 182 includes an external shell 184 that provides both physical and electrical insulation for devices within the external shell 184. In an embodiment, the board 182 holds a chipset (see FIG. 3).

In an embodiment, the integrated-circuit device package 108 is a base structure for a disaggregated-die computing system 108 that includes chiplets, e.g. 170, 170' and 170"

coupled to the first integrated-circuit die 150, one chiplet 170 of which is illustrated coupled to the first integrated-circuit die 150 at active devices and metallization 152 by a through-silicon via (TSV) 158. The copper pillar 136 contacts an electrical bump that contact a bonding pad 145 that is part of the first integrated-circuit die 150.

Similarly in an embodiment, the integrated-circuit device package 108 is a base structure for a disaggregated-die computing system 108 that includes chiplets 174, 174' and 174" coupled to the subsequent integrated-circuit die 160, one chiplet 174" of which is illustrated coupled to the subsequent integrated-circuit die 174" at active devices and metallization 162 through a TSV 168.

In an embodiment, the sEMIB 120 is laid out in a three-level-trace and bond-pad configuration, as depicted in an Inset 108i according to an embodiment. The integrated-circuit package substrate 110 is depicted in part, and the metallic plate 112 is an Nth metal layer in the integrated-circuit package substrate 110. The Nth metal layer in an embodiment, is the top conductive layer in a 3-2-3 package-layer count for the integrated-circuit substrate 110.

The bridge vias 138 as well as bridge copper studs 140 are coupled to a signal layer 144, which is at the bridge bond-pad layer 144 depicted in Inset 7i. The Nth metal layer 112 is a voltage source, source (VSS) layer, as well as a middle layer 193, which is also coupled to VSS. As illustrated, a signal layer 195 abuts the die-attach film 116, and signal integrity is enhanced by location of the signal layer 195, across from the die-attach film 116 and opposite the Nth metal layer 112 as a VSS layer 112.

In an embodiment, processing by use of the release layer 122 illustrated in FIG. 1D, leaves a release layer inclusion 197 that can be detected between the polyimide film 142 and the ultimate layer 132. Such release-layer inclusions 197 can be incidental to stripping the glass substrate 118, also seen in FIG. 1D.

In an embodiment, the build-up film 132 is a single solder-resist material that is curable by useful light wavelengths, whether it is a positive photoresist or a negative photoresist. Accordingly with the single photoresist build-up film 132 covering the stripped embedded multi-die interconnect bridge 120, the Z-height of the plate 112 is about 12 micrometer (μm), the die-attach film is about 5 μm, the sEMIB 120 is about 10 μm, and the portion of the build-up film 132 above the sEMIB 120 is about 5-10 μm.

In an embodiment, the first integrated-circuit die 150 and at least one chiplet, e.g. 170' make a disaggregated-die logic processor. In an embodiment, the subsequent integrated-circuit die 160 and at least one chiplet, e.g. 174' make a disaggregated-die graphics processor.

In an embodiment, the first integrated-circuit die 150 and all chiplets, e.g. 170, 170' and 170", as well as the subsequent integrated-circuit die 160 and all chiplets, e.g. 174, 174' and 174" make a disaggregated-die logic processor. In an embodiment, the first integrated-circuit die 150 and all chiplets, e.g. 170, 170' and 170", as well as the subsequent integrated-circuit die 160 and all chiplets, e.g. 174, 174' and 174" make a disaggregated-die graphics processor.

In an embodiment, the sEMIB 120 is made to translate between two or more design-rule geometries, where the first integrated-circuit die 150 has a larger design-rule geometry than that of the subsequent integrated-circuit die 160. Consequently as a stripped RDL 120, the sEMIB 120 translates between at least two different design-rule geometries.

FIG. 2 is a process flow diagram according to several embodiments.

At 210, the process includes seating a glass-based manufactured interconnect bridge on a die-attach film at a penultimate layer of an integrated-circuit package substrate. In an embodiment, the inorganic base is semiconductive or undoped silicon that is a sacrificial substrate.

At 220, the process includes releasing the glass from the interconnect bridge.

At 230, the process includes forming an ultimate dielectric layer on the integrated-circuit package substrate and the interconnect bridge.

At 240, the process includes connecting a first integrated-circuit chip, and a subsequent integrated-circuit chip to the sEMIB, only through the ultimate dielectric layer.

At 250, the process includes assembling the sEMIB to a computing system.

FIG. 3 is included to show an example of a higher-level device application for the disclosed embodiments. The stripped embedded multi-die interconnect bridge embodiments may be found in several parts of a computing system. In an embodiment, the stripped embedded multi-die interconnect bridge is part of a communications apparatus such as is affixed to a cellular communications tower. In an embodiment, a computing system 300 includes, but is not limited to, a desktop computer. In an embodiment, a system 300 includes, but is not limited to a laptop computer. In an embodiment, a system 300 includes, but is not limited to a netbook. In an embodiment, a system 300 includes, but is not limited to a tablet. In an embodiment, a system 300 includes, but is not limited to a notebook computer. In an embodiment, a system 300 includes, but is not limited to a personal digital assistant (PDA). In an embodiment, a system 300 includes, but is not limited to a server. In an embodiment, a system 300 includes, but is not limited to a workstation. In an embodiment, a system 300 includes, but is not limited to a cellular telephone. In an embodiment, a system 300 includes, but is not limited to a mobile computing device. In an embodiment, a system 300 includes, but is not limited to a smart phone. In an embodiment, a system 300 includes, but is not limited to an internet appliance. Other types of computing devices may be configured with the microelectronic device that includes stripped embedded multi-die interconnect bridge embodiments.

In an embodiment, the processor 310 has one or more processing cores 312 and 312N, where 312N represents the Nth processor core inside processor 310 where N is a positive integer. In an embodiment, the electronic device system 300 using a stripped embedded multi-die interconnect bridge embodiment that includes multiple processors including 310 and 305, where the processor 305 has logic similar or identical to the logic of the processor 310. In an embodiment, the processing core 312 includes, but is not limited to, pre-fetch logic to fetch instructions, decode logic to decode the instructions, execution logic to execute instructions and the like. In an embodiment, the processor 310 has a cache memory 316 to cache at least one of instructions and data for the stripped embedded multi-die interconnect bridge in the system 300. The cache memory 316 may be organized into a hierarchal structure including one or more levels of cache memory.

In an embodiment, the processor 310 includes a memory controller 314, which is operable to perform functions that enable the processor 310 to access and communicate with memory 330 that includes at least one of a volatile memory 332 and a non-volatile memory 334. In an embodiment, the processor 310 is coupled with memory 330 and chipset 320. In an embodiment, the chipset 320 is part of a system-in-package with a stripped embedded multi-die interconnect bridge depicted in FIG. 1H, and Inset 108*i*. The processor 310 may also be coupled to a wireless antenna 378 to communicate with any device configured to at least one of transmit and receive wireless signals. In an embodiment, the wireless antenna interface 378 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 334 includes, but is not limited to, flash memory, phase change memory (PCM), read-only memory (ROM), electrically erasable programmable read-only memory (EEPROM), or any other type of non-volatile memory device.

The memory 330 stores information and instructions to be executed by the processor 310. In an embodiment, the memory 330 may also store temporary variables or other intermediate information while the processor 310 is executing instructions. In the illustrated embodiment, the chipset 320 connects with processor 310 via Point-to-Point (PtP or P-P) interfaces 317 and 322. Either of these PtP embodiments may be achieved using a stripped embedded multi-die interconnect bridge embodiment as set forth in this disclosure. The chipset 320 enables the processor 310 to connect to other elements in a stripped embedded multi-die interconnect bridge embodiment in a system 300. In an embodiment, interfaces 317 and 322 operate in accordance with a PtP communication protocol such as the Intel® QuickPath Interconnect (QPI) or the like. In other embodiments, a different interconnect may be used.

In an embodiment, the chipset 320 is operable to communicate with the processor 310, 305N, the display device 340, and other devices 372, 376, 374, 360, 362, 364, 366, 377, etc. The chipset 320 may also be coupled to a wireless antenna 378 to communicate with any device configured to at least do one of transmit and receive wireless signals.

The chipset 320 connects to the display device 340 via the interface 326. The display 340 may be, for example, a liquid crystal display (LCD), a plasma display, cathode ray tube (CRT) display, or any other form of visual display device. In an embodiment, the processor 310 and the chipset 320 are merged into a stripped embedded multi-die interconnect bridge in a computing system. Additionally, the chipset 320 connects to one or more buses 350 and 355 that interconnect various elements 374, 360, 362, 364, and 366. Buses 350 and 355 may be interconnected together via a bus bridge 372 such as at least one stripped embedded multi-die interconnect bridge package apparatus embodiment. In an embodiment, the chipset 320, via interface 324, couples with a non-volatile memory 360, a mass storage device(s) 362, a keyboard/mouse 364, a network interface 366, smart TV 376, and the consumer electronics 377, etc.

In an embodiment, the mass storage device 362 includes, but is not limited to, a solid state drive, a hard disk drive, a universal serial bus flash memory drive, or any other form of computer data storage medium. In one embodiment, the network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the embedded magnetic inductor and a stripped embedded multi-die interconnect bridge package in a computing system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into the processor core 312.

In an embodiment, a single processor 310 includes stripped embedded multi-die interconnect bridge embodiments with chiplets, such as one, all or more than the chiplets 170 through 170" and optionally one, all or more than the chiplets 174 through 174", making up the single processor 310.

Where useful, the computing system 300 may have a broadcasting structure interface such as for affixing the apparatus to a cellular tower.

FIG. 4 is a top plan 400 and partial cut-away of the computing system 108 depicted in FIG. 1H according to several embodiments. The disaggregated-die computing system 108 depicted in FIG. 1H is seen at the cross-section line 1H-1H. The first integrated-circuit die 150 is seen in below a chiplet array, as well as the subsequent integrated-circuit die 160. The first-die chiplets 170, 170' and 170" are seen above the first die 150 according to an embodiment. Similarly, the subsequent-die chiplets 174, 174' and 174" are seen above the subsequent die 160 according to an embodiment.

In an embodiment, a 3×4 array of chiplet spaces is configured on the backside surface of the first integrated-circuit chip 150, but four of the spaces are taken up by heat slugs 463 to facilitate heat removal from the first chip 150 and into a heat sink such as an integrated heat spreader that contacts the heat slugs. In an embodiment, all first chiplet spaces are taken up by integrated-circuit chiplets. Similarly in an embodiment, a 3×4 array of chiplet spaces is configured on the backside surface of the subsequent chip 160, but four of the spaces are taken up by heat slugs 481 to facilitate heat removal from the subsequent die 160 and into the same heat sink that contacts the heat slugs 463 according to an embodiment. In an embodiment, all subsequent chiplet spaces are taken up by integrated-circuit chiplets.

As illustrated, different useful patterns for heat slugs 463 and 481 are applied above the respective first and subsequent integrated-circuit chips 150 and 160, depending upon heat-extraction usefulness.

To illustrate the stripped embedded multi-die interconnect bridge embodiments and methods disclosed herein, a non-limiting list of examples is provided herein:

Example 1 is an integrated-circuit device package, comprising: a first integrated-circuit die on an integrated-circuit package substrate, wherein the integrated-circuit package substrate includes a die side and a land side; an interconnect bridge on a penultimate layer of the integrated-circuit package substrate; a single dielectric layer over the interconnect bridge, wherein the single dielectric layer includes the die side as an ultimate layer, is penetrated by a bridge via that contacts the interconnect bridge, and wherein the single dielectric layer is penetrated by a package via that is electrically coupled to the land side.

In Example 2, the subject matter of Example 1 optionally includes wherein the interconnect bridge is on a die-attach film that is on the penultimate layer of the integrated-circuit package substrate.

In Example 3, the subject matter of any one or more of Examples 1-2 optionally include wherein the interconnect bridge is on a die-attach film that is on the penultimate layer of the integrated-circuit package substrate, and wherein the interconnect bridge has three conductive layers with a bottom conductive layer contacting the die-attach film, and a top conductive layer being contacted by the bridge via.

In Example 4, the subject matter of any one or more of Examples 1-3 optionally include micrometer.

In Example 5, the subject matter of any one or more of Examples 1-4 optionally include a first integrated-circuit die that is coupled to the bridge via that contacts the interconnect bridge, and that is coupled to the package via.

In Example 6, the subject matter of any one or more of Examples 1-5 optionally include a first integrated-circuit die that is coupled to the bridge via, wherein the bridge via contacts a copper bridge pad, that contacts an electrical bump, that contacts the first integrated-circuit die; and wherein the first integrated-circuit die is coupled to the land side through the package via, that contacts a copper pillar that contacts an electrical bump.

In Example 7, the subject matter of any one or more of Examples 1-6 optionally include a first integrated-circuit die that is coupled to the bridge via, wherein the bridge via contacts a copper bridge pad, that contacts an electrical bump, that contacts the first integrated-circuit die; wherein the first integrated-circuit die is coupled to the land side through the package via, that contacts a copper pillar that contacts an electrical bump; a subsequent integrated-circuit die that is coupled to subsequent bridge via, wherein the subsequent bridge via contacts a copper bridge pad, that contacts an electrical bump, that contacts the subsequent integrated-circuit die; and wherein the subsequent integrated-circuit die is coupled to the land side through a subsequent package via, that contacts a copper pillar that contacts an electrical bump.

In Example 8, the subject matter of any one or more of Examples 1-7 optionally include wherein the single dielectric layer covering is also over and contacting the penultimate layer.

In Example 9, the subject matter of Example 8 optionally includes wherein the interconnect bridge is on a die-attach film that is on the penultimate layer of the integrated-circuit package substrate.

In Example 10, the subject matter of any one or more of Examples 8-9 optionally include wherein the interconnect bridge is on a die-attach film that is on the penultimate layer of the integrated-circuit package substrate, and wherein the interconnect bridge has three conductive layers with a bottom conductive layer contacting the die-attach film.

In Example 11, the subject matter of any one or more of Examples 1-10 optionally include a first integrated-circuit die that is coupled to the bridge via that contacts the interconnect bridge, and that is coupled to the package via.

In Example 12, the subject matter of any one or more of Examples 1-11 optionally include a first integrated-circuit die that is coupled to the bridge via, wherein the bridge via contacts a copper bridge pad, that contacts an electrical bump, that contacts the first integrated-circuit die; and wherein the first integrated-circuit die is coupled to the land side through the package via, that contacts a copper pillar that contacts an electrical bump.

In Example 13, the subject matter of any one or more of Examples 1-12 optionally include wherein the ultimate layer, contacts a release-layer inclusion, the interconnect bridge further including a polyimide film that is penetrated by the bridge via, and wherein the release-layer inclusion is between the polyimide film and the ultimate layer.

Example 14 is a computing system, comprising: an integrated-circuit device package including a die side and a land side; a first integrated circuit on the integrated-circuit package substrate die side; an interconnect bridge on a penultimate layer of the integrated-circuit package substrate; a single dielectric layer covering over the interconnect bridge, wherein the single dielectric layer includes the die side as an ultimate layer, is penetrated by a bridge via that contacts the interconnect bridge, and wherein the single dielectric layer is penetrated by a package via that is electrically coupled to the land side; a first integrated-circuit die that is coupled to the bridge via, wherein the bridge via contacts a copper bridge pad, that contacts an electrical bump, that contacts the first integrated-circuit die; wherein the first integrated-circuit die is coupled to the land side through the package via, that contacts a copper pillar that contacts an electrical bump; a subsequent integrated-circuit die that is coupled to subsequent bridge via, wherein the subsequent bridge via contacts a copper bridge pad, that contacts an electrical bump, that contacts the subsequent integrated-circuit die; wherein the subsequent integrated-circuit die is coupled to the land side through a subsequent package via, that contacts a copper pillar that contacts an electrical bump; and wherein the first and subsequent integrated-circuit dice are part of a chipset.

In Example 15, the subject matter of Example 14 optionally includes more than one chiplet on the first integrated-circuit die at a backside, wherein one of the more than one chiplet communicates to the first integrated-circuit die through a through-silicon via.

In Example 16, the subject matter of any one or more of Examples 14-15 optionally include more than one chiplet on the first integrated-circuit die at a backside, wherein one of the more than one chiplet communicates to the first integrated-circuit die through a through-silicon via; and more than one chiplet on the subsequent integrated-circuit die at a backside, wherein one of the more than one chiplet communicates to the subsequent integrated-circuit die through a through-silicon via.

In Example 17, the subject matter of any one or more of Examples 14-16 optionally include more than one chiplet on the first integrated-circuit die at a backside, wherein one of the more than one chiplet communicates to the first integrated-circuit die through a through-silicon via; more than one chiplet on the subsequent integrated-circuit die at a backside, wherein one of the more than one chiplet communicates to the subsequent integrated-circuit die through a through-silicon via; and wherein at least one of the more than one chiplet on the first integrated-circuit, at least one of the more than one chiplet on the subsequent integrated-circuit die, and at least one of the first and subsequent integrated-circuit dice comprise a disaggregated logic processor.

In Example 18, the subject matter of any one or more of Examples 14-17 optionally include more than one chiplet on the first integrated-circuit die at a backside, wherein one of the more than one chiplet communicates to the first integrated-circuit die through a through-silicon via; more than one chiplet on the subsequent integrated-circuit die at a backside, wherein one of the more than one chiplet communicates to the subsequent integrated-circuit die through a through-silicon via; and wherein at least one of the more than one chiplet on the first integrated-circuit, wherein at least one of the more than one chiplet on the subsequent integrated-circuit die, and at least one of the first and subsequent integrated-circuit dice comprise a disaggregated graphics processor.

In Example 19, the subject matter of any one or more of Examples 14-18 optionally include more than one chiplet on the first integrated-circuit die at a backside, wherein one of the more than one chiplet communicates to the first integrated-circuit die through a through-silicon via; more than one chiplet on the subsequent integrated-circuit die at a backside, wherein one of the more than one chiplet communicates to the subsequent integrated-circuit die through a through-silicon via; wherein at least one of the more than one chiplet on the first integrated-circuit, wherein at least one of the more than one chiplet on the subsequent integrated-circuit die, and at least one of the first and subsequent integrated-circuit dice comprise a disaggregated logic processor, and wherein at least one of the more than one chiplet on the first integrated-circuit, wherein at least one of the more than one chiplet on the subsequent integrated-circuit die, and at least one of the first and subsequent integrated-circuit dice comprise a disaggregated graphics processor.

Example 20 is a process of forming an interconnect bridge, comprising: patterning a metallization on an inorganic substrate, including patterning three metallization layers including vias and traces; stripping the inorganic substrate after seating the metallization on a die-attach film of an integrated-circuit package substrate; and forming a single dielectric layer over the metallization and the integrated-circuit package substrate.

In Example 21, the subject matter of Example 20 optionally includes wherein patterning includes patterning with a top layer first and a bottom layer last, followed by inverting the metallization when seating on the die-attach film.

In Example 22, the subject matter of any one or more of Examples 20-21 optionally include connecting a first and a subsequent integrated-circuit die to the metallization through the single dielectric layer.

In Example 23, the subject matter of any one or more of Examples 20-22, optionally include wherein patterning the metallization on the inorganic substrate includes transmitting light energy through the inorganic substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit device package, comprising:
an interconnect bridge in a dielectric layer, the interconnect bridge comprising traces, and the interconnect bridge having a top side and a bottom side opposite the top side, a first side between the top side and the bottom side, and a second side between the top side and the bottom side;
a first via and a second via in the dielectric layer, the first via and the second via laterally adjacent to the first side of the interconnect bridge;

a third via and a fourth via in the dielectric layer, the third via and the fourth via laterally adjacent to the second side of the interconnect bridge;

a first integrated circuit chip coupled to the top side of the interconnect bridge, the first integrated circuit chip electrically coupled to the first via and the second via;

a second integrated circuit chip having a top side and a bottom side, the bottom side of the second integrated circuit chip coupled to the top side of the interconnect bridge, the second integrated circuit chip electrically coupled to the third via and the fourth via;

a third integrated circuit chip coupled to the top side of the second integrated circuit chip; and a plurality of bumps beneath interconnect bridge, the plurality of bumps within a footprint of the first side and the second side of the interconnect bridge.

2. The integrated-circuit device package of claim 1, wherein the first via, the second via, the third via, and the fourth via each have a lowermost surface that extends at least to the bottom side of the interconnect bridge.

3. The integrated-circuit device package of claim 1, wherein the first via, the second via, the third via, and the fourth via each have a lowermost surface that extends below the bottom side of the interconnect bridge.

4. The integrated-circuit device package of claim 1, wherein the first via, the second via, the third via, and the fourth via each have an uppermost surface above an uppermost surface of the interconnect bridge.

5. The integrated-circuit device package of claim 1, further comprising:
a fourth integrated circuit chip coupled to the top side of the second integrated circuit chip.

6. The integrated-circuit device package of claim 3, further comprising:
a fifth integrated circuit chip coupled to the top side of the second integrated circuit chip.

7. The integrated-circuit device package of claim 6, wherein the fourth integrated circuit chip is laterally adjacent to the third integrated circuit chip, and the fifth integrated circuit chip is laterally adjacent to the fourth integrated circuit chip.

8. The integrated-circuit device package of claim 6, wherein each of the third integrated circuit chip, the fourth integrated circuit chip, and the fifth integrated circuit chip is directly attached to the top side of the second integrated circuit chip.

9. The integrated-circuit device package of claim 6, wherein the second integrated circuit chip comprises a plurality of through silicon vias (TSVs) therein.

10. The integrated-circuit device package of claim 1, further comprising:
a sixth integrated circuit chip coupled to a top side of the first integrated circuit chip.

11. The integrated-circuit device package of claim 1, wherein the interconnect bridge is in direct contact with the dielectric layer, and wherein each of the first, second, third and fourth vias is in direct contact with the dielectric layer.

12. The integrated-circuit device package of claim 1, wherein the first integrated circuit chip is attached to the top side of the interconnect bridge by a plurality of pillars of the interconnect bridge and by a plurality of bonding pads of the first integrated circuit chip.

13. The integrated-circuit device package of claim 1, further comprising:
a heat slug coupled to the bottom side of the interconnect bridge.

14. The integrated-circuit device package of claim 13, wherein the heat slug is attached to the bottom side of the interconnect bridge by a die attach film.

15. The integrated-circuit device package of claim 13, wherein the heat slug is a VSS layer.

16. An integrated-circuit device package, comprising:
a silicon bridge in a dielectric layer, the silicon bridge comprising traces, and the silicon bridge having a top side and a bottom side opposite the top side, a first side between the top side and the bottom side, and a second side between the top side and the bottom side;

a first via in the dielectric layer, the first via laterally adjacent to the first side of the silicon bridge;

a second via in the dielectric layer, the second via laterally adjacent to the second side of the silicon bridge;

a first integrated circuit chip coupled to the top side of the silicon bridge, the first integrated circuit chip electrically coupled to the first via;

a second integrated circuit chip having a top side and a bottom side, the bottom side of the second integrated circuit chip coupled to the top side of the silicon bridge, the second integrated circuit chip electrically coupled to the second via;

a third integrated circuit chip coupled to the top side of the second integrated circuit chip; and a plurality of bumps beneath silicon bridge, the plurality of bumps within a footprint of the first side and the second side of the silicon bridge.

17. The integrated-circuit device package of claim 16, wherein the first via and the second via each have an uppermost surface above an uppermost surface of the silicon bridge.

18. The integrated-circuit device package of claim 16, wherein the first integrated circuit chip is attached to the top side of the silicon bridge by a pillar of the silicon bridge and by a bonding pad of the first integrated circuit chip.

19. The integrated-circuit device package of claim 16, further comprising:
a heat slug coupled to the bottom side of the silicon bridge.

20. The integrated-circuit device package of claim 19, wherein the heat slug is attached to the bottom side of the silicon bridge by a die attach film.

21. The integrated-circuit device package of claim 19, wherein the heat slug is a VSS layer.

22. The integrated-circuit device package of claim 16, further comprising:
a fourth integrated circuit chip coupled to the top side of the second integrated circuit chip; and
a fifth integrated circuit chip coupled to the top side of the second integrated circuit chip.

* * * * *

UNITED STATES PATENT AND TRADEMARK OFFICE
CERTIFICATE OF CORRECTION

PATENT NO. : 11,908,793 B2
APPLICATION NO. : 17/716937
DATED : February 20, 2024
INVENTOR(S) : Jiun Hann Sir et al.

Page 1 of 1

It is certified that error appears in the above-identified patent and that said Letters Patent is hereby corrected as shown below:

In the Claims

Column 13, Claim 6, 33rd Line, delete "3" and insert --5--

Signed and Sealed this
Second Day of September, 2025

Coke Morgan Stewart
*Acting Director of the United States Patent and Trademark Office*